United States Patent
Tomita et al.

(10) Patent No.: US 9,685,388 B2
(45) Date of Patent: Jun. 20, 2017

(54) PICTURE FRAME STIFFENERS FOR MICROELECTRONIC PACKAGES

(71) Applicant: Intel Corporation, Santa Clara, CA (US)

(72) Inventors: Yoshihiro Tomita, Tsukuba (JP); Jiro Kubota, Tsukuba (JP); Omkar G. Karhade, Chandler, AZ (US); Shawna M. Liff, Scottsdale, AZ (US); Kinya Ichikawa, Tsukuba (JP); Nitin A. Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/296,995

(22) Filed: Oct. 18, 2016

(65) Prior Publication Data

US 2017/0040238 A1    Feb. 9, 2017

Related U.S. Application Data

(63) Continuation of application No. 14/571,623, filed on Dec. 16, 2014, now Pat. No. 9,502,368.

(51) Int. Cl.
*H01L 23/18* (2006.01)
*H01L 21/56* (2006.01)
(Continued)

(52) U.S. Cl.
CPC ........... *H01L 23/18* (2013.01); *H01L 21/566* (2013.01); *H01L 23/49805* (2013.01);
(Continued)

(58) Field of Classification Search
None
See application file for complete search history.

(56) References Cited

U.S. PATENT DOCUMENTS

| 5,835,355 | A | 11/1998 | Dordi |
| 6,020,221 | A | 2/2000 | Lim et al. |

(Continued)

FOREIGN PATENT DOCUMENTS

| JP | 2003-142648 A | 5/2003 |
| JP | 2007-227550 A | 9/2007 |

(Continued)

OTHER PUBLICATIONS

Office Action & Search Report received for Taiwan Patent Application No. 104136026, mailed on Aug. 9, 2016, 7 pages of Taiwan Office Action including 1 page of English Translation of Search Report.

(Continued)

*Primary Examiner* — Michael Lebentritt
(74) *Attorney, Agent, or Firm* — Winkle, PLLC

(57) ABSTRACT

A microelectronic package may be formed with a picture frame stiffener surrounding a microelectronic die for reducing warpage of the microelectronic package. An embodiment for fabricating such a microelectronic package may include forming a microelectronic die having an active surface and an opposing back surface, wherein the microelectronic die active surface may be attached to a microelectronic substrate. A picture frame stiffener having an opening therethrough may be formed and placed on a release film, wherein a mold material may be deposited over the picture frame stiffener and the release film. The microelectronic die may be inserted into the mold material, wherein at least a portion of the microelectronic die extends into the picture frame opening. The release film may be removed and a portion of the mold material extending over the microelectronic die back surface may then be removed to form the microelectronic package.

11 Claims, 8 Drawing Sheets

(51) Int. Cl.
*H01L 25/10* (2006.01)
*H01L 23/538* (2006.01)
*H01L 23/498* (2006.01)

(52) U.S. Cl.
CPC ........ *H01L 23/5389* (2013.01); *H01L 25/105* (2013.01); *H01L 2225/107* (2013.01); *H01L 2225/1035* (2013.01)

(56) References Cited

U.S. PATENT DOCUMENTS

| | | |
|---|---|---|
| 6,472,762 B1 | 10/2002 | Kutlu |
| 6,724,080 B1 | 4/2004 | Ooi et al. |
| 6,975,512 B1 | 12/2005 | Ooi |
| 6,989,593 B2 | 1/2006 | Khan et al. |
| 7,115,988 B1 | 10/2006 | Hool |
| 7,173,329 B2 | 2/2007 | Frutschy et al. |
| 7,241,645 B2 | 7/2007 | Zhao et al. |
| 7,309,912 B1 | 12/2007 | Shi et al. |
| 7,482,686 B2 | 1/2009 | Zhao et al. |
| 7,585,702 B1 | 9/2009 | Wang et al. |
| 8,120,170 B2 | 2/2012 | McLellan et al. |
| 8,618,652 B2 | 12/2013 | Nalla et al. |
| 8,679,900 B2 | 3/2014 | Choi et al. |
| 9,257,364 B2 | 2/2016 | Ahuja et al. |
| 9,502,368 B2 * | 11/2016 | Tomita .................. H01L 24/17 |
| 2005/0280140 A1 | 12/2005 | Corbin et al. |
| 2008/0237840 A1 | 10/2008 | Alcoe et al. |
| 2010/0020503 A1 | 1/2010 | Beaumier et al. |
| 2010/0258927 A1 | 10/2010 | Ganesan et al. |
| 2011/0001233 A1 | 1/2011 | Iwase et al. |
| 2011/0147913 A1 | 6/2011 | Roberts et al. |
| 2013/0056863 A1 | 3/2013 | Chi et al. |
| 2014/0048951 A1 | 2/2014 | Lin et al. |
| 2016/0095209 A1 | 3/2016 | Starkston et al. |

FOREIGN PATENT DOCUMENTS

| | | |
|---|---|---|
| JP | 2010-251367 A | 11/2010 |
| JP | 2011-096903 A | 5/2011 |
| JP | 2011-176112 A | 9/2011 |
| JP | 2013-033853 A | 2/2013 |
| JP | 2013-524491 A | 6/2013 |
| JP | 2013-243318 A | 12/2013 |
| JP | 2014-049477 A | 3/2014 |
| WO | 2012/029549 A1 | 3/2012 |

OTHER PUBLICATIONS

Office Action received for Japanese Patent Application No. 2015-223709, mailed on Oct. 18, 2016, 8 pages of Japanese Office Action including 4 pages of English Translation.

\* cited by examiner

PICTURE FRAME STIFFENERS FOR MICROELECTRONIC PACKAGES

RELATED APPLICATION

The present application is a Divisional of U.S. patent application Ser. No. 14/571,623, filed on Dec. 16, 2014, entitled "PICTURE FRAME STIFFENERS FOR MICROELECTRONIC PACKAGES".

TECHNICAL FIELD

Embodiments of the present description generally relate to the field of microelectronic package fabrication, and, more particularly, to using stiffeners within microelectronic packages to reduce warpage thereof.

BACKGROUND

The microelectronic industry is continually striving to produce ever faster and smaller microelectronic packages for use in various electronic products, including, but not limited to, computer server products and portable products, such as portable computers, electronic tablets, cellular phones, digital cameras, and the like. As these goals are achieved, the fabrication of the microelectronic packages becomes more challenging.

Microelectronic packages generally include at least one microelectronic die attached to a microelectronic substrate, such as an interposer. Microelectronic substrates are generally composed of alternating layers of dielectric material (such as organic materials) and metal (such as copper) which is patterned to form conductive routes. The microelectronic die, such as a silicon die having integrated circuitry formed therein, may be physically and electrically attached to the microelectronic substrate, such that the conductive routes in the microelectronic substrate direct electronic signals to and from the integrated circuitry of the microelectronic die. However, the components of the microelectronic package have differing coefficients of thermal expansion. For example, at room temperature (e.g. about 25° C.), an organic dielectric material, such as a silica-filled epoxy (such as materials available from Ajinomoto Fine-Techno Co., Inc., 1-2 Suzuki-cho, Kawasaki-ku, Kawasaki-shi, 210-0801, Japan (e.g. Ajinomoto ABF GX-92)), has a coefficient of thermal expansion of about 39 ppm/° C., a metal for the conductive routes, such as copper, has a coefficient of thermal expansion of about 17 ppm/° C., and a microelectronic die, such as silicon, has a coefficient of thermal expansion of about 2.6 ppm/° C. The fundamental differences in the thermal expansion of these components may result in temperature dependent deformation or warpage of the microelectronic package. This warpage may cause significant issues during the attachment of the microelectronic package to external substrates, such non-wet opens and solder bump bridging. This warpage can be mitigated by utilizing a thick "core" material at the center of the microelectronic substrate. This core material generally has a high glass transition temperate and a low coefficient of thermal expansion, which lowers the composite coefficient of thermal expansion of the microelectronic substrate. However, the core material coefficient of thermal expansion has already been reduced below 4 ppm/° C. and is becoming increasingly difficult to reduce further. Additionally, there is significant demand to reduce the total height or thickness of microelectronic packages. Much of this reduction is achieved by thinning the core material, in turn, giving the core material less influence on warpage. Given these factors, it is important to develop new warpage control methodologies, especially for height/thickness constrained microelectronic packages, such as those used in cellular phones and electronic tablets.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
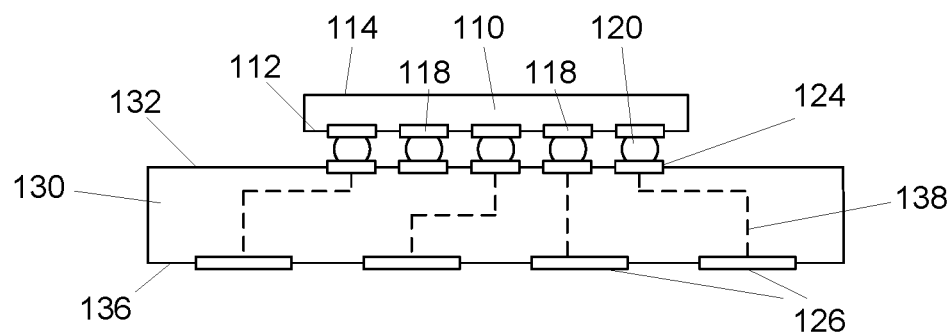
FIG. 1 is a side cross sectional view of a microelectronic die attached to a microelectronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic package having a picture frame stiffener surrounding a microelectronic die for reducing warpage of the microelectronic package. An embodiment for fabricating such a microelectronic package may include forming a microelectronic die having an active surface and an opposing back surface, wherein the microelectronic die active surface may be attached to a microelectronic substrate. A picture frame stiffener having an opening therethrough may be formed and placed on a release film, wherein a mold material may be deposited over the picture frame stiffener and the release film. The microelectronic die may be inserted into the mold material, wherein at least a portion of the microelectronic die extends into the picture frame opening. The release film may be removed and a portion of the mold material extending over the microelectronic die back surface may be removed to form the microelectronic package.

In FIG. 1, at least one microelectronic die 110, such as a microprocessor, a chipset, a graphics device, a wireless device, a memory device, an application specific integrated circuit, or the like, may be attached to a microelectronic substrate 130, such as an interposer, through a plurality of interconnects 120. The interconnects 120 may extend between bond pads 118 on an active surface 112 of the microelectronic die 110 and mirror-image bond pads 124 on a first surface 132 of the microelectronic substrate 130, in a configuration generally known as a flip-chip or controlled collapse chip connection ("C4") configuration. The microelectronic die bond pads 118 may be in electrical communication with integrated circuitry (not shown) within the microelectronic die 110. The microelectronic substrate bond pads 124 may be in electrical communication with conductive routes 138 within the microelectronic substrate 130. The conductive routes 138 may provide electrical communication routes between the microelectronic die 110 on the microelectronic substrate 130 and/or to other components (not shown), and may provide electrical communication routes to attachment lands 126 proximate a second surface 136 of the microelectronic substrate 130 for attached to a microelectronic board (not shown).

The microelectronic substrate 130 may comprise any appropriate dielectric material, including, by not limited to, liquid crystal polymer, epoxy resin, bismaleimide triazine resin, FR4, polyimide materials, and the like. The conductive routes 138 may be formed of any appropriate conductive material, including, but not limited to, copper, silver, gold, nickel, and alloys thereof. It is understood that the microelectronic substrate 130 may be formed from any number of dielectric layers, may contain a rigid core (not shown), and may contain active and/or passive microelectronic devices (not shown) formed therein. It is further understood that the conductive routes 138 could form any desired electrical route within the microelectronic substrate 130 and/or with additional external components (not shown). It is also understood that solder resist layers (not shown) could be utilized on the microelectronic substrate first surface 132 and the microelectronic substrate second surface 136, as will be understood to those skilled in the art. The processes used for forming the microelectronic substrate 130 are well known to those skilled in the art, and for the sake of brevity and conciseness will not be described or illustrated herein.

The interconnects 120 can be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic die 110 is attached to the microelectronic substrate 130 with interconnects 120 made of solder, the solder is reflowed, either by heat, pressure, and/or sonic energy to secure the solder between the microelectronic die bond pads 118 and the microelectronic substrate bond pads 124. Additionally, the microelectronic die 110 may be a copper pillar based flip chip component which is attached to the microelectronic substrate 130, as will be understood to those skilled in the art.

Figure 2:
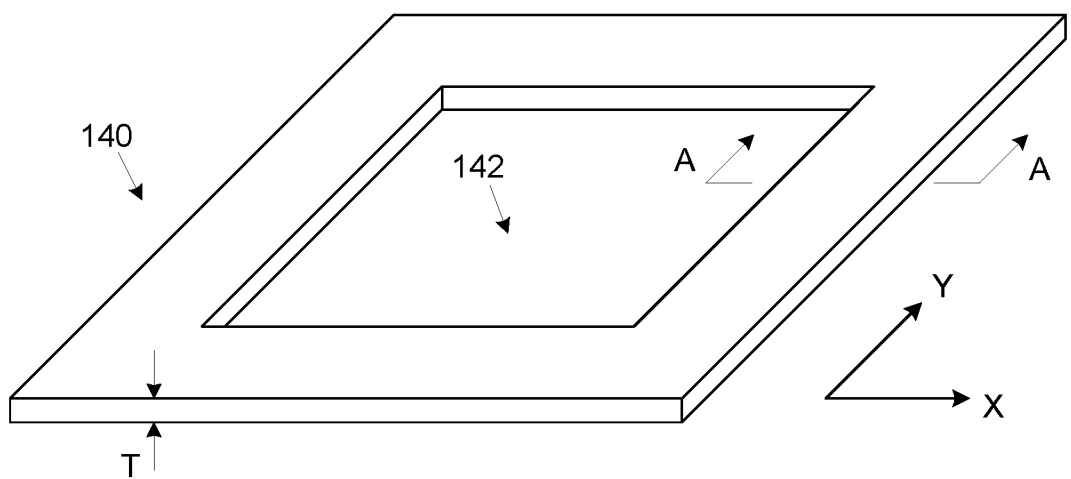
FIGS. 2 and 3 are oblique and side cross sectional views of a picture frame stiffener, according to an embodiment of the present description.
Figure 3:
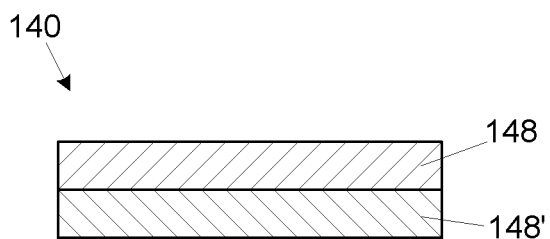

As shown in FIG. 2, a stiffener 140 may be formed. The stiffener 140 may be substantially planar (in an X direction and Y direction) with an opening 142 therethrough, such that it resembles a frame for a picture. As such, the stiffener 140 will be hereinafter referred to as a "picture frame stiffener". In one embodiment, the picture frame stiffener 140 and/or the picture frame stiffener opening 142 are substantially rectangular. In another embodiment, the picture frame stiffener 140 and/or the picture frame stiffener opening 142 is substantially square. The picture frame stiffener 140 may be formed from any appropriate, substantially ridge materials, including, but not limited to, organic resins and metals. In one embodiment, the stiffener may have a thickness T for between about 50 and 100 µm. As shown in FIG. 3 (view along line A-A of FIG. 2), the stiffener 140 may comprise more than one layer (illustrated as first layer 148 and second layer 148'), wherein the first layer 148 and the second layer 148' may have differing coefficients of thermal expansion, which may assist in balancing warpage, as will be understood to those skilled in the art.

Figure 4:
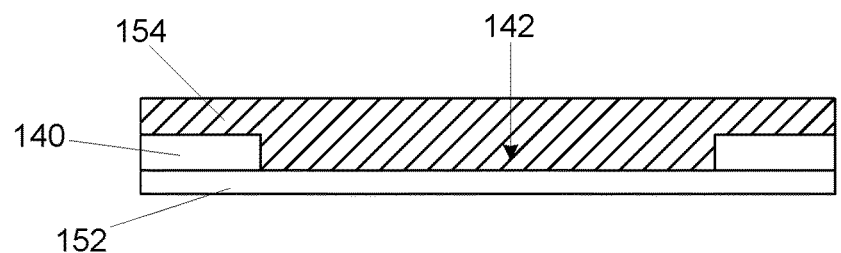
FIGS. 4-7 are cross sectional views of forming a microelectronic package incorporating a picture frame stiffener, according to an embodiment of the present description.

As shown in FIG. 4, the picture frame stiffener 140 may be positioned on a release film 152 and a mold material 154 may be disposed over the picture frame stiffener 140 and the release film 152, such that the picture frame stiffener 140 is at least partially embedded in the mold material 154. The release film 152 may be any appropriate carrier material, including flexible polymer materials that may include an adhesive component. The mold material 154 may be any appropriate encapsulation material, such as an epoxy resins and filled epoxy resins.

Figure 5:
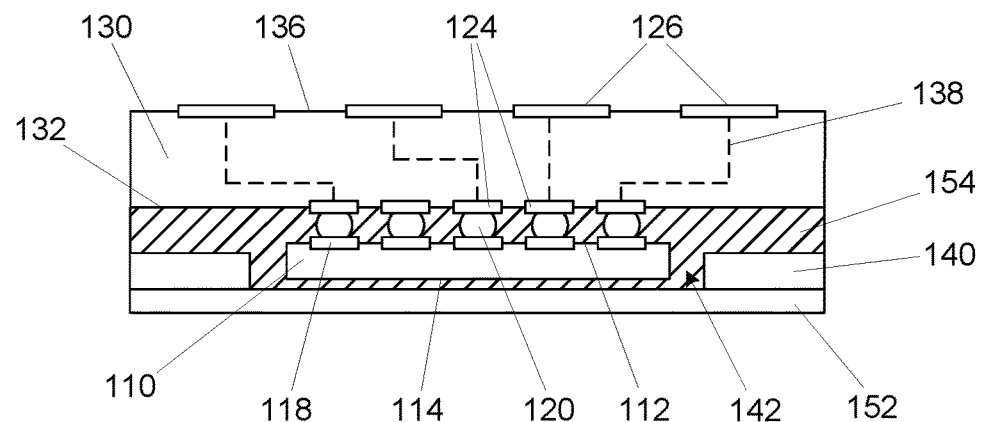

As shown in FIG. 5, the structure of FIG. 1 may be aligned such that a back surface 114 of the microelectronic die 110 faces the release film 152 and wherein the microelectronic die 110 may be inserted into the mold material 154 such that at least a portion of the microelectronic die 110 resides within the picture frame stiffener opening 142, and such that the mold material 154 contacts the microelectronic substrate first surface 132. In one embodiment, the mold material 154 may have a viscosity which allows it to flow and fill between the microelectronic substrate first surface 132 and the microelectronic die active surface 112 to encapsulate the interconnects 120. However, it is understood that an underfill material (not shown) may be disposed between the microelectronic substrate first surface 132 and the microelectronic die active surface 112 prior to inserting the microelectronic die 110 into the mold material 154.

Figure 6:
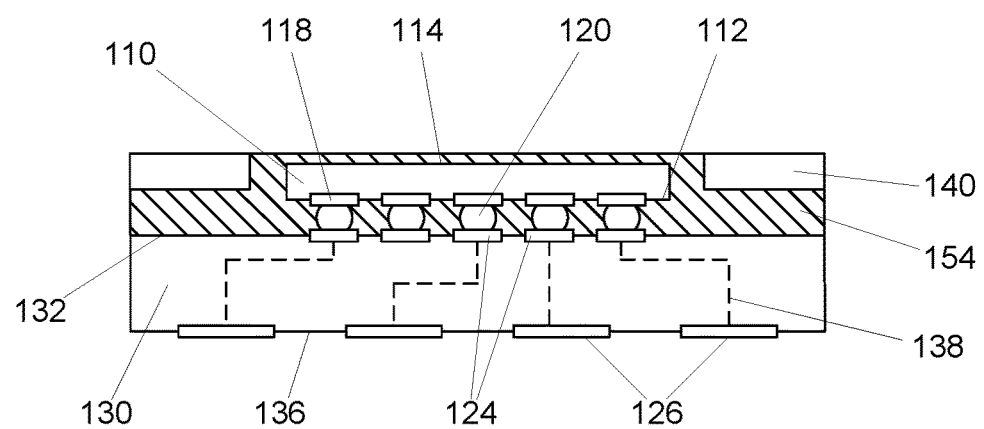
Figure 7:
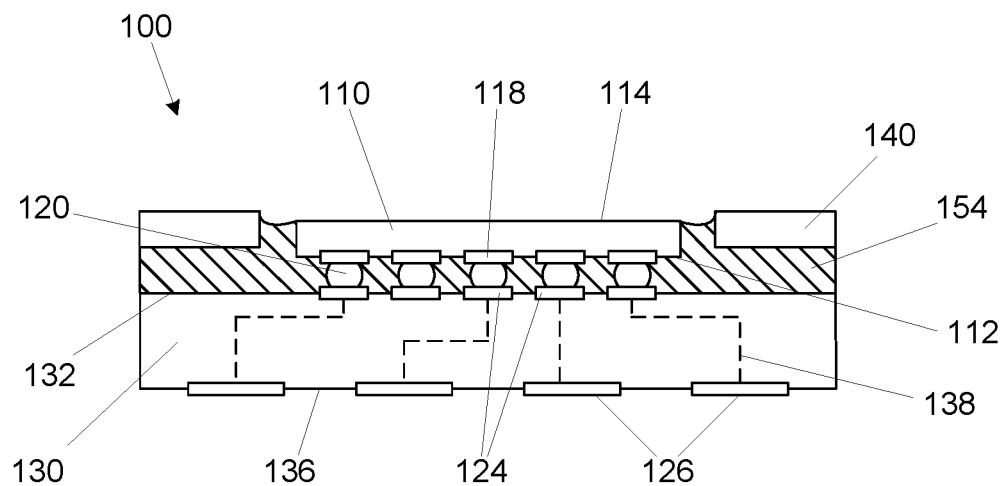

As shown in FIG. 6, the mold material 154 may be cured, either fully or partially, such as by heating, and the release file 152 (see FIG. 4) may be removed. As shown in FIG. 7, any mold material 154 residing on the microelectronic die back surface 114 may be removed, such as by wet or dry etching, laser ablation, ion bombardment, particle blasting, abrasion, or the like, to form a microelectronic package 100. By removing the mold material 154 residing on the microelectronic die back surface 114, the microelectronic die back surface 114 may exposed for electrical connection to through-silicon vias (not shown), for attachment of a heat dissipation device, and the like.

Although FIGS. 1-7 illustrate a single microelectronic die 110, it is understood that a plurality of microelectronic dice may be attached to the microelectronic substrate 130. It is also understood that the microelectronic die 110 should be inserted as far into the picture frame stiffener opening 142 as possible to minimize the overall thickness of the resulting microelectronic package 100.

Figure 8:
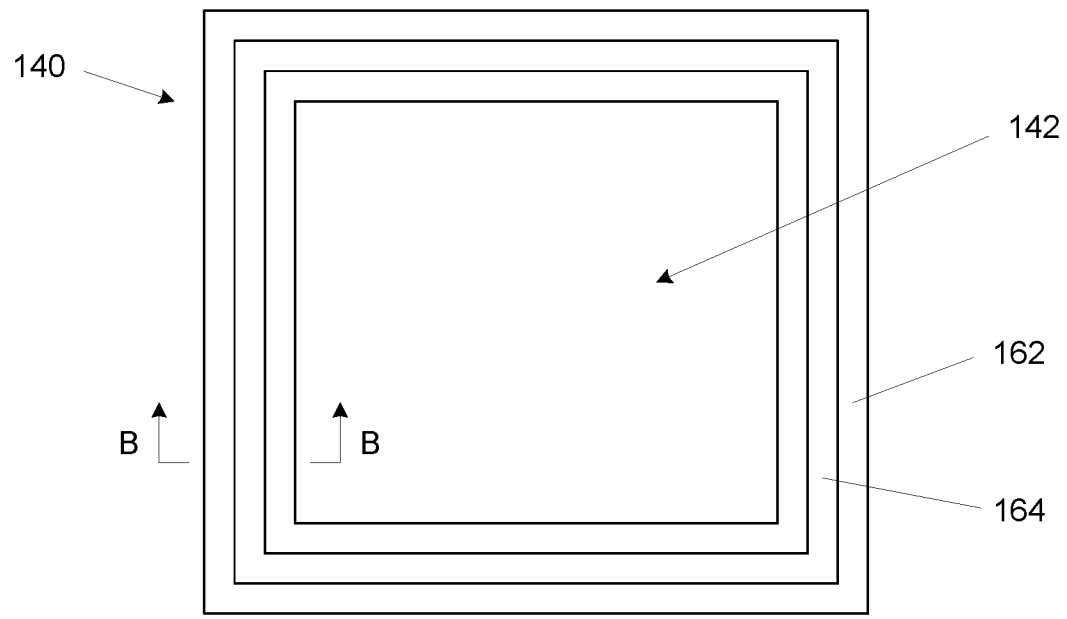
FIGS. 8-11 are top plan and side cross sectional views of picture frame stiffeners having rigidity projections, according to embodiments of the present description.
Figure 9:
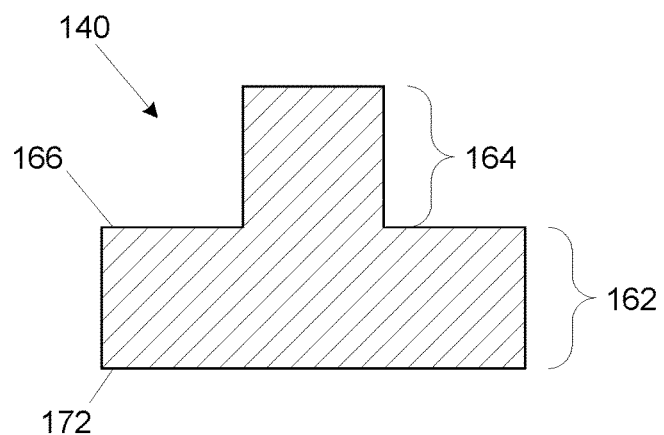
Figure 10:
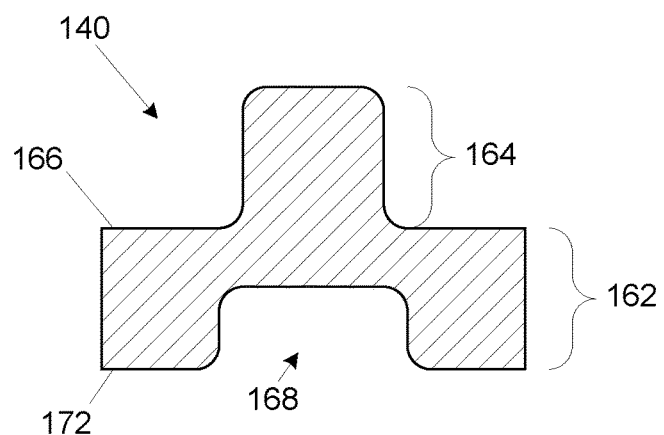
Figure 11:
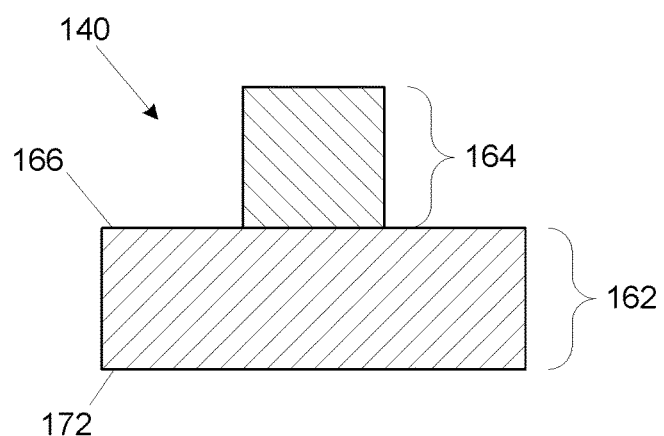

As shown in FIGS. 8-11, the picture frame stiffener 140 may have configurations to enhance bending resistance. For example, as shown in FIG. 8, the picture frame stiffener 140 may comprise a base portion 162 and a rigidity projection 164 extending from a first surface 166 of the picture frame stiffener base portion 162. As shown in FIG. 9 (view along line B-B of FIG. 8, the rigidity projection 164 may be formed be to integral with the material of the picture frame stiffener base portion 162 (i.e. made from a single continuous material), such as when the picture frame stiffener 140 is formed by molding, skiving, or the like. As shown in FIG. 10 (view along line B-B of FIG. 8), the rigidity projection 164 may be formed by a stamping process, which would result in the rigidity projection 164 extending from a first surface 166 of the picture frame stiffener base portion 162 and an indent 168 extending into the picture frame stiffener base portion 162 from a second surface 172 thereof. As shown in FIG. 11 (view along line B-B of FIG. 8), the picture frame stiffener projection 162 may be a separate structure that is attached to picture frame stiffener base portion first surface 166, wherein the rigidity projection 164 may have a coefficient of thermal expansion that differs from the picture frame stiffener base portion 162, which may assist in balancing warpage, as will be understood to those skilled in the art.

Figure 12:
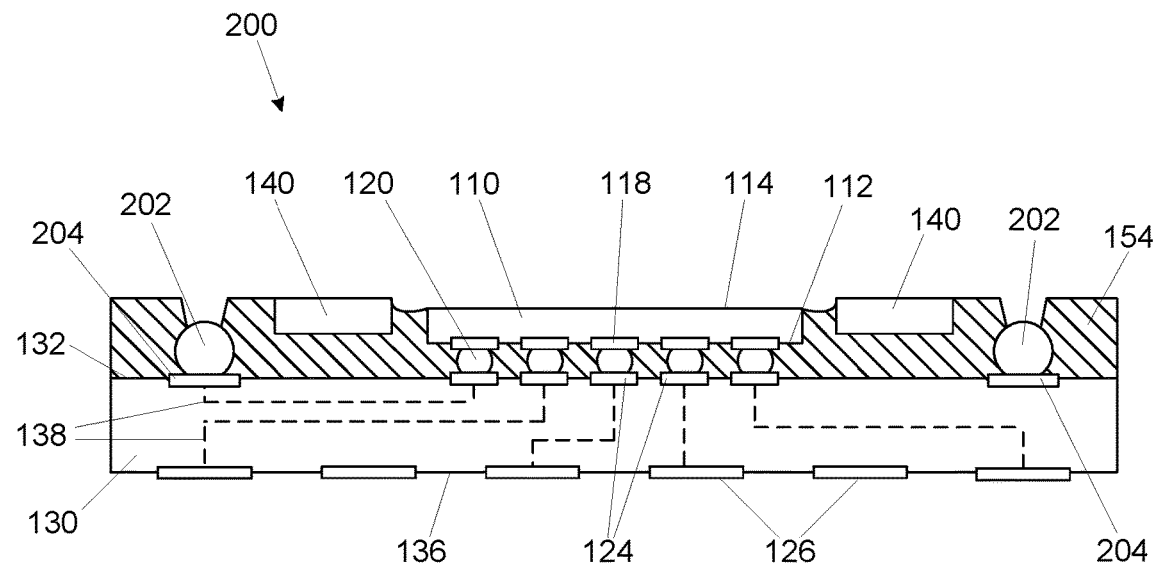
FIG. 12-14 are cross sectional views of microelectronic packages incorporating picture frame stiffeners, according to embodiments of the present description.

In an embodiment of an intermediate microelectronic package 200 of the present description, at least one through mold interconnect 202 may be formed on a corresponding bond pad 204 on the microelectronic substrate first surface 132 prior to insertion into the mold material 154, as shown in FIG. 12. The through mold interconnect bond pads 204 may be electrical communication with corresponding conductive routes 138 within the microelectronic substrate 130. As further, shown in FIG. 12, a portion of the mold material 154 may be removed to expose a portion of the through mold interconnects 202, such as by wet or dry etching, laser ablation, ion bombardment, particle blasting, abrasion, or the like, to allow for the subsequent connection of addition electrical components (not shown).

Figure 13:
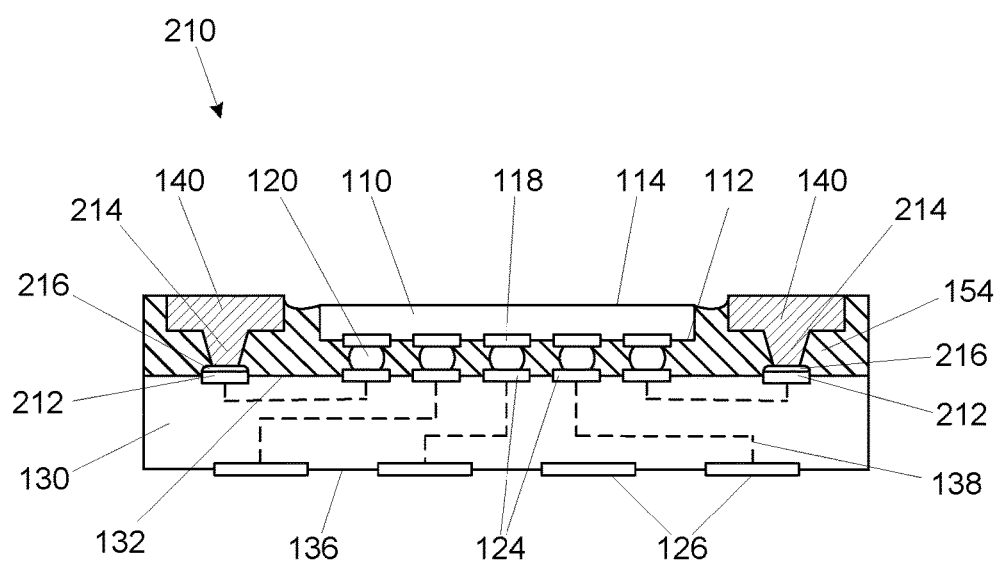

In a further embodiment of an intermediate microelectronic package 210 of the present description, as shown in FIG. 13, the picture frame stiffener 140 may be a lead-frame type, wherein the picture frame stiffener 140 may be made of a conductive material which is in electrical communication with stiffener connection bond pads 212 on the microelectronic substrate first surface 132. In one embodiment, the picture frame stiffener 140 may have at least one conductive projection 214 extending therefrom, wherein the conductive projection 214 may contact a corresponding pre-solder material 216 (disposed on the stiffener connection bond pads 212 prior to insertion of the microelectronic die 110 into the mold material 154. The stiffener connection bond pads 212 may be electrical communication with corresponding conductive routes 138 within the microelectronic substrate 130. In one embodiment, the picture frame stiffener 140 may provide power or ground to the microelectronic die 110.

Figure 14:
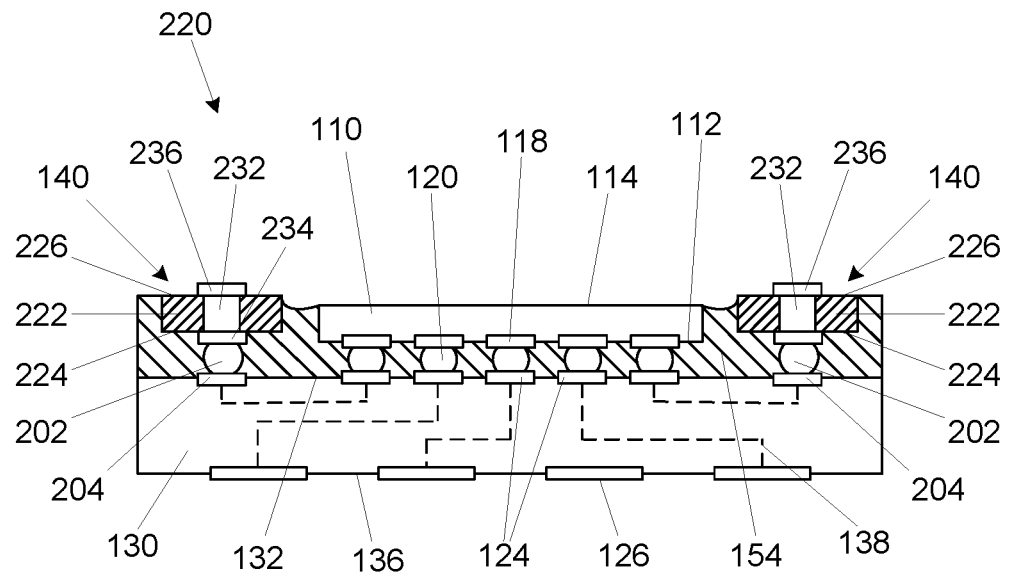

In still another embodiment of an intermediate microelectronic package 220 of the present description, as shown in FIG. 14, the picture frame stiffener 140 may be an interposer type, wherein the picture frame stiffener 140 may comprise a dielectric material 222, having a first surface 224 and a second surface 226, and at least one conductive via 232 extending from the dielectric material first surface 224 to the dielectric material second surface 226. The picture frame stiffener 140 may further include first surface contact bond pads 234 in electrical contact with the stiffener conductive vias 232 at the dielectric material first surface 224 and second surface contact bond pads 236 in electrical contact with the stiffener conductive vias 232 at the dielectric material second surface 226. As further shown in shown FIG. 14, the first surface contact bond pads 234 may be in electrical contact with through mold interconnects 202 formed on bond pads 204 on the microelectronic substrate first surface 132 prior to insertion into the mold material 154, such as was illustrate for FIG. 12. The through mold interconnect bond pads 204 may be electrical communication with corresponding conductive routes 138 within the microelectronic substrate 130. As will be understood to those skilled in the art, the incorporation of the conductive vias 232 into the stiffener 140 may reduce the size of intermediate microelectronic package 220 and any subsequent package formed therefrom.

Figure 15:
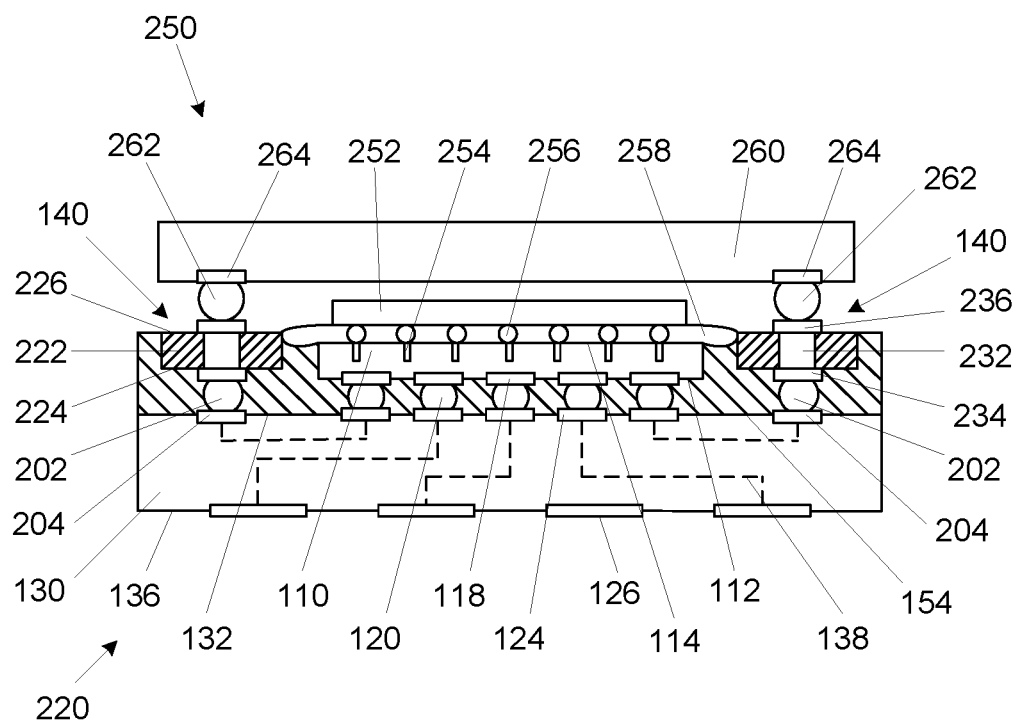
FIG. 15 is a cross sectional view of a package-on-package microelectronic package, according to an embodiment of the present description.

As shown in FIG. 15, the intermediate microelectronic package 220 may be a part of a package-on-package ("PoP") microelectronic package 250, wherein a secondary microelectronic die 252 may be electrically attached by secondary die interconnects 256 to through-silicon vias 254 extending into the microelectronic die 110 from the back surface 114 thereof to integrated circuitry (not shown) within the microelectronic die 110. An underfill material 258 may be disposed between the microelectronic die 110 and the secondary microelectronic die 252. A secondary microelectronic package 260 may be attached to the intermediate package 220 through package-to-package interconnects 262 extending between bond pads 264 on the secondary microelectronic package 260 and the second surface contact bond pads 236 of the picture frame stiffener 140. The secondary microelectronic package bond pads 264 may be electronic communication with microelectronic components (not shown) within the secondary microelectronic package 260.

Figure 16:
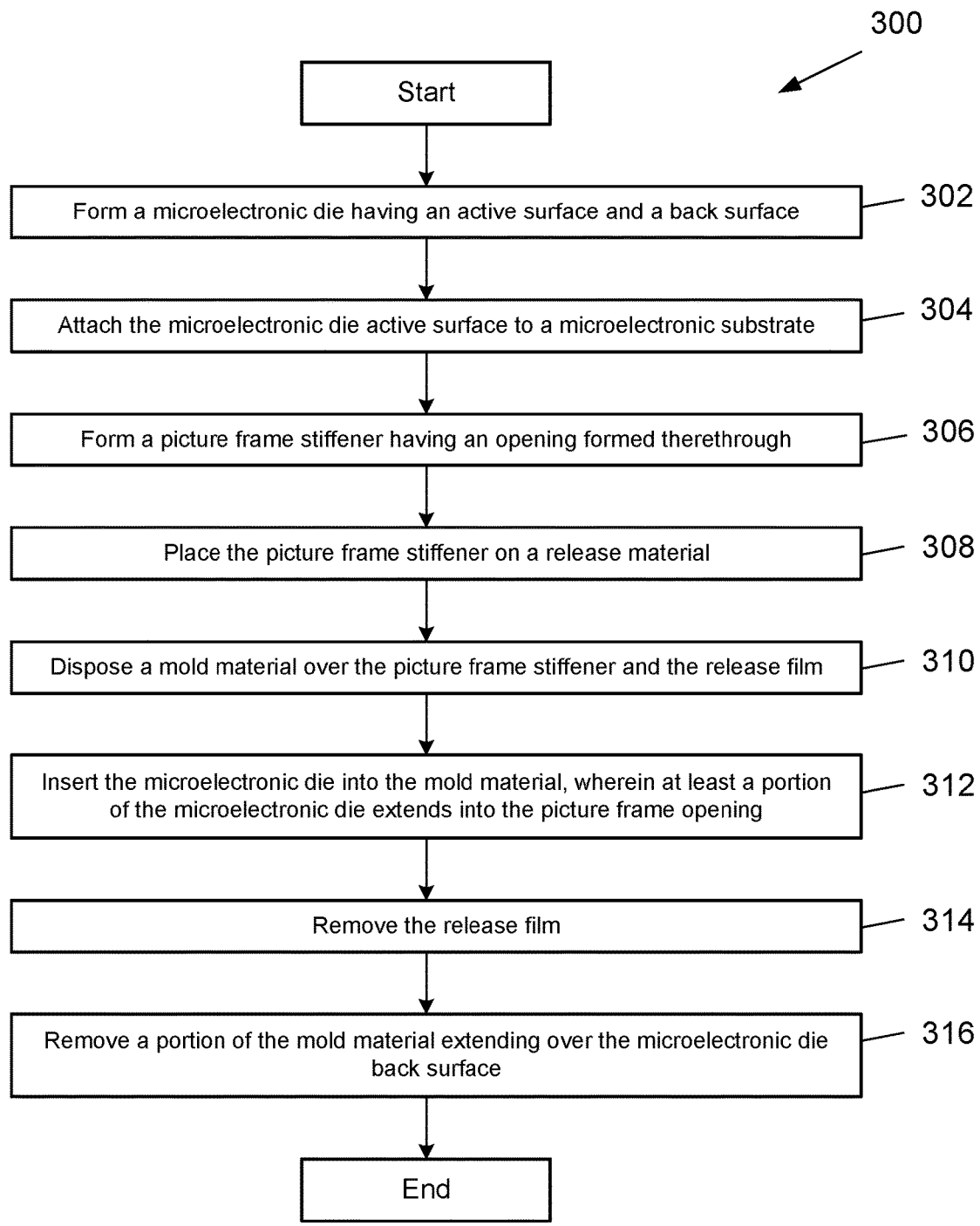
FIG. 16 is a flow chart of a process of fabricating a microelectronic package, according to an embodiment of the present description.

FIG. 16 is a flow chart of a process 300 of fabricating a microelectronic package according to an embodiment of the present description. As set forth in block 302, a microelectronic die may be formed having an active surface and an opposing back surface. The microelectronic die active surface may be attached to a microelectronic substrate, as set forth in block 304. As set forth in block 306, a picture frame stiffener may be formed having an opening formed therethrough. The picture frame stiffener may be placed on a release film, as set in block 308. As set forth in block 310, a mold material may be disposed over the picture frame stiffener and the release film. The microelectronic die may be inserted into the mold material, wherein at least a portion of the microelectronic die extends into the picture frame opening, as set forth in block 312. As set forth in block 314, the release film may be removed. A portion of the mold material extending over the microelectronic die back surface may be removed, as set forth in block 316.

Figure 17:
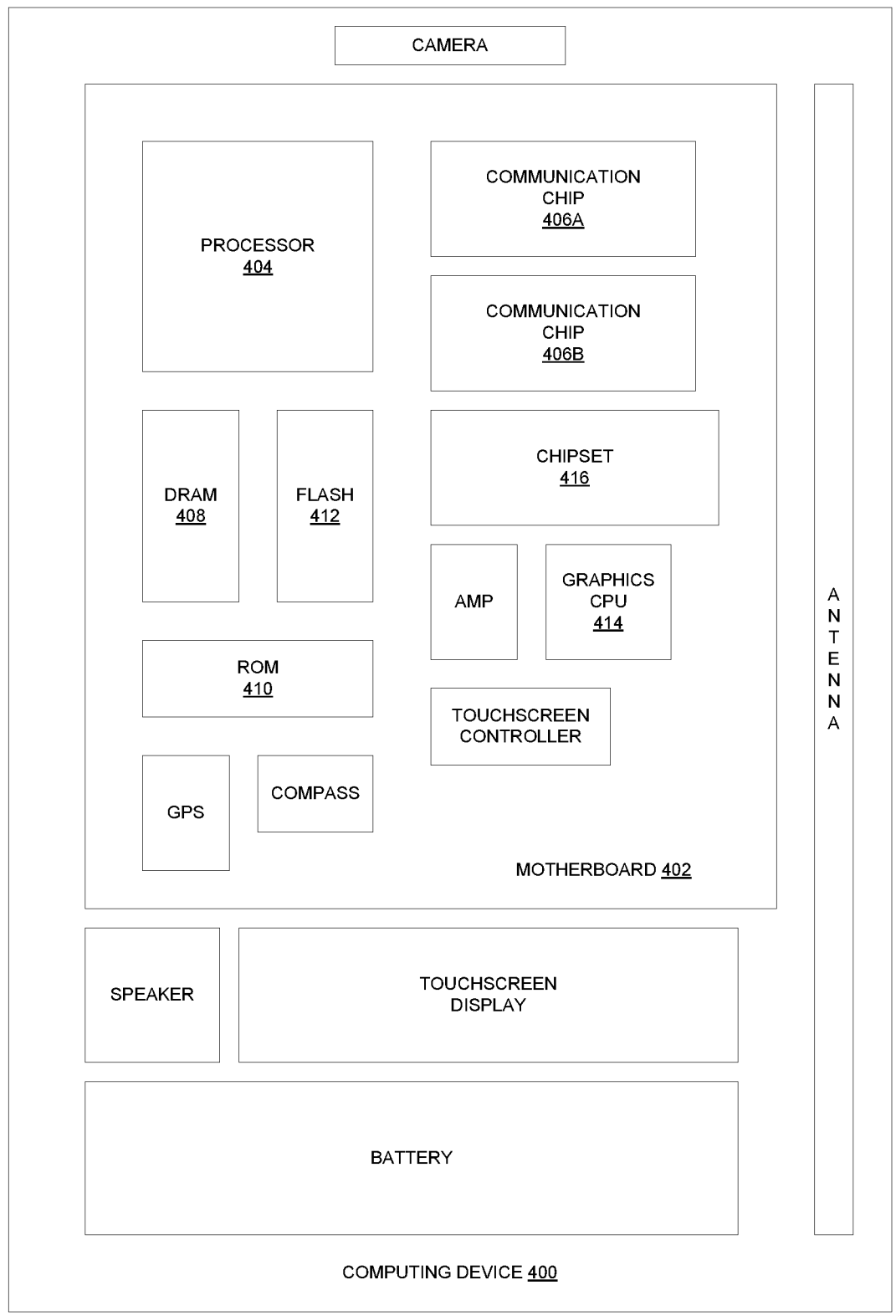
FIG. 17 illustrates a computing device in accordance with one implementation of the present description.

FIG. 17 illustrates a computing device 400 in accordance with one implementation of the present description. The computing device 400 houses a board 402. The board may include a number of microelectronic components, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a microelectronic package having a picture frame stiffener as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-17. The subject matter may be applied to other microelectronic device and assembly applications, as will be understood to those skilled in the art.

The following examples pertain to further embodiments, wherein Example 1 is a microelectronic package comprising forming a microelectronic die having an active surface and a back surface, wherein the microelectronic die is electrically connected to a microelectronic substrate through interconnects extending between the microelectronic die active surface and a first surface of the microelectronic substrate; a mold material abutting the microelectronic device and the microelectronic substrate first surface; and a picture frame stiffener having a opening therethrough, wherein the picture frame stiffener is at least partially embedded in the mold material, wherein at least a portion of the microelectronic die extends into the picture frame opening, and wherein the mold material does not extend over the microelectronic die back surface.

In Example 2, the subject matter of Example 1 can optionally include the picture frame stiffener comprising a layered structure having at least two material layers having differing coefficients of thermal expansion.

In Example 3, the subject matter of Example 1 can optionally include the picture frame stiffener comprising a base portion and a rigidity projection extending from a first surface of the base portion.

In Example 4, the subject matter of Example 3 can optionally include the rigidity projection being integral to the base portion.

In Example 5, the subject matter of Example 3 can optionally include the rigidity projection and the base portion comprising differing materials having differing coefficients of thermal expansion.

In Example 6, the subject matter of any of Examples 1 to 5 can optionally include at least one through mold interconnect extending from a corresponding through mold interconnect bond pad on the microelectronic substrate first surface.

In Example 7, the subject matter of Example 1 can optionally include the picture frame stiffener being electrically conductive and includes at least one electrically conductive projection extending through the mold material and electrically contacting a corresponding stiffener connection bond pad on the microelectronic substrate first surface.

In Example 8, the subject matter of either of Example 1 can optionally include the picture frame stiffener comprising a dielectric material having a first surface and a second surface, and at least one conductive via extending from the dielectric material first surface to the dielectric material second surface.

In Example 9, the subject matter of Example 8 can optionally include at least one through mold interconnect extending from a corresponding through mold interconnect bond pad on the microelectronic substrate first surface, wherein the at least one through mold interconnect is in electrical contact with the at least one conductive via of the picture frame stiffener.

In Example 10, the subject matter of Example 9 can optionally include a secondary microelectronic package in electrical contact with the at least one conductive via of the picture frame stiffener.

In Example 11, the subject matter of Example 10 can optionally include a secondary microelectronic die electrically connected to through-silicon vias extending into the microelectronic die from the microelectronic die back surface.

The following examples pertain to further embodiments, wherein Example 12 is a method of fabricating a microelectronic package comprising forming a microelectronic die having an active surface and an opposing back surface; attaching the microelectronic die active surface to a microelectronic substrate; forming a picture frame stiffener having an opening formed therethrough; placing the picture frame stiffener on a release film; disposing a mold material over the picture frame stiffener and the release film; inserting the microelectronic die into the mold material, wherein at least a portion of the microelectronic die extends into the picture frame opening; removing the release film; and removing a portion of the mold material extending over the microelectronic die back surface.

In Example 13, the subject matter of Example 12 can optionally include forming the picture frame stiffener comprising forming a layered structure having at least two material layers having differing coefficients of thermal expansion.

In Example 14, the subject matter of Example 12 can optionally include forming the picture frame stiffener comprising forming a base portion and a rigidity projection extending from a first surface of the base portion.

In Example 15, the subject matter of Example 14 can optionally include forming the picture frame stiffener comprising forming the rigidity projection integrally with the base portion.

In Example 16, the subject matter of Example 14 can optionally include forming the picture frame stiffer comprises forming the rigidity projection and the base portion from differing materials having differing coefficients of thermal expansion.

In Example 17, the subject matter of any of Examples 12 to 16 can optionally include forming at least one through mold interconnect extending from a corresponding through mold interconnect bond pad on the microelectronic substrate first surface prior to inserting the microelectronic die into the mold material.

In Example 18, the subject matter of Example 12 can optionally include forming the picture frame stiffener comprising forming an electrically conductive picture frame stiffener having at least one electrically conductive projection extending through the mold material and electrically contacting a corresponding stiffener connection bond pad formed on the microelectronic substrate first surface.

In Example 19, the subject matter of Example 12 can optionally include forming the picture frame stiffener comprises forming a dielectric material having a first surface and a second surface, and forming at least one conductive via extending from the dielectric material first surface to the dielectric material second surface.

In Example 20, the subject matter of Example 19 can optionally include forming at least one through mold interconnect extending from a corresponding through mold interconnect bond pad on the microelectronic substrate first surface, wherein the at least one through mold interconnect is in electrical contact with the at least one conductive via of the picture frame stiffener.

In Example 21, the subject matter of Example 20 can optionally include electrically contacting a secondary microelectronic package with the at least one conductive via of the picture frame stiffener.

In Example 22, the subject matter of Example 21 can optionally include electrically connecting a secondary microelectronic die to through-silicon vias extending into the microelectronic die from the microelectronic die back surface.

The following examples pertain to further embodiments, wherein Example 23 is a computing device, comprising a board; and a microelectronic package attached to the board, wherein the microelectronic package includes: a microelectronic die having an active surface and a back surface, wherein the microelectronic die is electrically connected to a microelectronic substrate through interconnects extending between the microelectronic die active surface and a first surface of the microelectronic substrate; a mold material abutting the microelectronic device and the microelectronic substrate first surface; and a picture frame stiffener having a opening therethrough, wherein the picture frame stiffener is at least partially embedded in the mold material, wherein at least a portion of the microelectronic die extends into the picture frame opening; and wherein the mold material does not extend over the microelectronic die back surface.

In Example 24, the subject matter of Example 23 can optionally include the picture frame stiffener comprising a base portion and a rigidity projection extending from a first surface of the base portion.

In Example 25, the subject matter of Example 24 can optionally include the rigidity projection being integral to the base portion.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A method of fabricating a microelectronic package, comprising:
    forming a microelectronic die having an active surface and an opposing back surface;
    attaching the microelectronic die active surface to a microelectronic substrate;
    forming a picture frame stiffener having an opening formed therethrough;
    placing the picture frame stiffener on a release film;
    disposing a mold material over the picture frame stiffener and the release film;
    inserting the microelectronic die into the mold material, wherein at least a portion of the microelectronic die extends into the picture frame opening;
    removing the release film; and
    removing a portion of the mold material extending over the microelectronic die back surface.

2. The method of claim 1, wherein forming the picture frame stiffener comprises forming a layered structure having at least two material layers having differing coefficients of thermal expansion.

3. The method of claim 1, wherein forming the picture frame stiffener comprises forming a base portion and a rigidity projection extending from a first surface of the base portion.

4. The method of claim 3, wherein forming the picture frame stiffener comprises forming the rigidity projection integrally with the base portion.

5. The method of claim 3, wherein forming the picture frame stiffer comprises forming the rigidity projection and the base portion from differing materials having differing coefficients of thermal expansion.

6. The method of claim 1, further including forming at least one through mold interconnect extending from a corresponding through mold interconnect bond pad on the microelectronic substrate first surface prior to inserting the microelectronic die into the mold material.

7. The method of claim 1, wherein forming the picture frame stiffener comprises forming an electrically conductive picture frame stiffener having at least one electrically conductive projection extending through the mold material and electrically contacting a corresponding stiffener connection bond pad formed on the microelectronic substrate first surface.

8. The method of claim 1, wherein forming the picture frame stiffener comprises forming a dielectric material having a first surface and a second surface, and forming at least one conductive via extending from the dielectric material first surface to the dielectric material second surface.

9. The method of claim 8, further including forming at least one through mold interconnect extending from a corresponding through mold interconnect bond pad on the microelectronic substrate first surface, wherein the at least one through mold interconnect is in electrical contact with the at least one conductive via of the picture frame stiffener.

10. The method of claim 9, further including electrically contacting a secondary microelectronic package with the at least one conductive via of the picture frame stiffener.

11. The method of claim 10, further including electrically connecting a secondary microelectronic die to through-silicon vias extending into the microelectronic die from the microelectronic die back surface.

* * * * *